United States Patent
Kim (10) Patent No.: US 9,685,637 B2
(45) Date of Patent: Jun. 20, 2017

(54) METHOD AND APPARATUS FOR REPAIRING A DISPLAY PANEL

(71) Applicant: Samsung Display Co., Ltd., Yongin, Gyeonggi-do (KR)

(72) Inventor: Joon-Geol Kim, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 15 days.

(21) Appl. No.: 14/510,411

(22) Filed: Oct. 9, 2014

(65) Prior Publication Data

US 2015/0364726 A1 Dec. 17, 2015

(30) Foreign Application Priority Data

Jun. 12, 2014 (KR) .................. 10-2014-0071490

(51) Int. Cl.
| | | |
|---|---|---|
| H01L 21/00 | (2006.01) | |
| H01L 51/56 | (2006.01) | |
| C23C 16/48 | (2006.01) | |
| H01L 27/32 | (2006.01) | |

(52) U.S. Cl.
CPC .............. H01L 51/56 (2013.01); C23C 16/48 (2013.01); *H01L 27/3244* (2013.01); *H01L 2251/556* (2013.01); *H01L 2251/568* (2013.01)

(58) Field of Classification Search
CPC ............. G02F 1/136259; G02F 1/1309; H01L 21/76892

USPC ....................................................... 438/4, 12
See application file for complete search history.

(56) References Cited

U.S. PATENT DOCUMENTS

| | | | |
|---|---|---|---|
| 5,480,812 A | * | 1/1996 | Salisbury .......... H01L 21/76892 257/448 |
| 2008/0037598 A1 | | 2/2008 | Miller et al. |
| 2010/0260226 A1 | | 10/2010 | Tamaya et al. |
| 2012/0012170 A1 | * | 1/2012 | Foss .................... H01L 31/0682 136/256 |

FOREIGN PATENT DOCUMENTS

| | | |
|---|---|---|
| JP | 1996-0507180 | 7/1993 |
| KR | 10-2006-0014581 | 2/2006 |
| KR | 10-2007-0043708 | 4/2007 |
| KR | 10-2007-0080636 | 8/2007 |
| KR | 10-2009-0023576 | 3/2009 |
| KR | 10-2010-0072087 | 6/2010 |
| KR | 10-2012-0114533 | 10/2012 |

* cited by examiner

*Primary Examiner* — Reema Patel
*Assistant Examiner* — Syed Gheyas
(74) *Attorney, Agent, or Firm* — Knobbe Martens Olson & Bear LLP (57) ABSTRACT

An apparatus and method for repairing a display panel are provided. The apparatus includes a laser emitter that etches a faulty portion of the display panel and a first surrounding portion of the faulty portion by irradiating the faulty portion and the first surrounding portion with a laser and a guide disposed to face the laser emitter and configured to adjust at least one of a temperature of the faulty portion or a temperature of the first surrounding portion.

19 Claims, 6 Drawing Sheets

METHOD AND APPARATUS FOR REPAIRING A DISPLAY PANEL

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application claims the benefit of Korean Patent Application No. 10-2014-0071490, filed on Jun. 12, 2014, in the Korean Intellectual Property Office, the disclosure of which is incorporated herein in its entirety by reference.

BACKGROUND

Field

One or more embodiments of the present invention relate to an apparatus and method for repairing a display panel.

Description of the Related Technology

Portable electronic devices are being widely used. Examples of portable electronic devices include small electronic devices such as mobile phones, tablet PCs, and the like.

Such portable electronic devices include display panels to provide visual information, such as, for example, images, to users and to support various functions. Recently, due to the reduced sizes of components for driving display panels, the display panels are becoming more important in electronic devices. Also, the display panels are being developed so that they may be bent at a predetermined angle from a flat state.

Faults in the display panels may be determined during or after a manufacturing process. When there are faults, the display panels may be repaired using various methods.

SUMMARY OF CERTAIN INVENTIVE ASPECTS

One or more embodiments of the present invention include an apparatus and method for repairing a display panel.

Additional aspects will be set forth in part in the description which follows and, in part, will be apparent from the description, or may be learned by practice of the presented embodiments.

According to one or more embodiments of the present invention, an apparatus for repairing a display panel includes a laser emitter that etches a faulty portion of the display panel and a first surrounding portion of the faulty portion by irradiating the faulty portion and the first surrounding portion with a laser; and a guide that is disposed to face the laser emitter and is configured to adjust at least one of a temperature of the faulty portion or a temperature of the first surrounding portion.

The guide may increase the temperature of the faulty portion to a temperature higher than the temperature of the first surrounding portion.

The guide may decrease the temperature of the first surrounding portion, excluding the faulty portion.

The guide may increase the temperature of only the faulty portion.

The guide may increase the temperature of the faulty portion and decrease the temperature of the first surrounding portion.

The guide may adjust at least one of an etching depth of the faulty portion or an etching depth of the first surrounding portion such that the etching depth of the faulty portion and the etching depth of the first surrounding portion are different from each other.

The etching depth of the faulty portion may be greater than the etching depth of the first surrounding portion.

The guide may adjust at least one of the temperature of the faulty portion or the temperature of the first surrounding portion so that the faulty portion and the first surrounding portion are etched in a stair-step structure.

The display panel may include a second surrounding portion around the first surrounding portion of the faulty portion.

The laser may etch the second surrounding and the guide may be further configured to adjust a temperature of the second surrounding portion.

According to one or more embodiments of the present invention, a method of repairing a display panel includes identifying a faulty portion of the display panel; etching the faulty portion and a first surrounding portion of the faulty portion by irradiating the faulty portion and the first surrounding portion with a laser; and adjusting at least one of a temperature of the faulty portion or a temperature of the first surrounding portion while irradiating the faulty portion and the first surrounding portion with the laser.

The faulty portion may be heated such that the temperature of the faulty portion increases.

The surrounding portion may be cooled such that the temperature of the first surrounding portion decreases.

The faulty portion may be heated such that the temperature of the faulty portion increases, and the first surrounding portion may be cooled such that the temperature of the first surrounding portion decreases.

The faulty portion and the first surrounding portion may be etched in a stair-step structure.

An etching depth of the faulty portion may be greater than an etching depth of the first surrounding portion.

The faulty portion and the first surrounding portion may be formed as a plurality of layers. The repairing of the display panel may include sequentially stacking layers that are the same as layers etched in the faulty portion and the first surrounding portion.

The method may further include etching a second surrounding portion of the faulty portion by irradiating the second surrounding portion with a laser.

The method may further include adjusting a temperature of the second surrounding portion while irradiating the second surrounding portion with the laser.

The faulty portion, the first surrounding portion and the second surrounding portion may be formed as a plurality of layers, and the repairing of the display panel may include sequentially stacking layers that are the same as layers etched in the faulty portion, the first surrounding portion and the second surrounding portion.

These general and specific embodiments may be implemented by using a system, a method, a computer program, or a combination of the system, the method, and the computer program.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION OF CERTAIN INVENTIVE EMBODIMENTS

Reference will now be made in detail to embodiments, examples of which are illustrated in the accompanying drawings, wherein like reference numerals generally refer to like elements throughout. In this regard, the embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

It will be understood that although the terms "first", "second", and the like may be used herein to describe various components, these components should not be limited by these terms. These components are only used to distinguish one component from another.

As used herein, the singular forms "a," "an" and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present.

Sizes of elements in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

Figure 1:
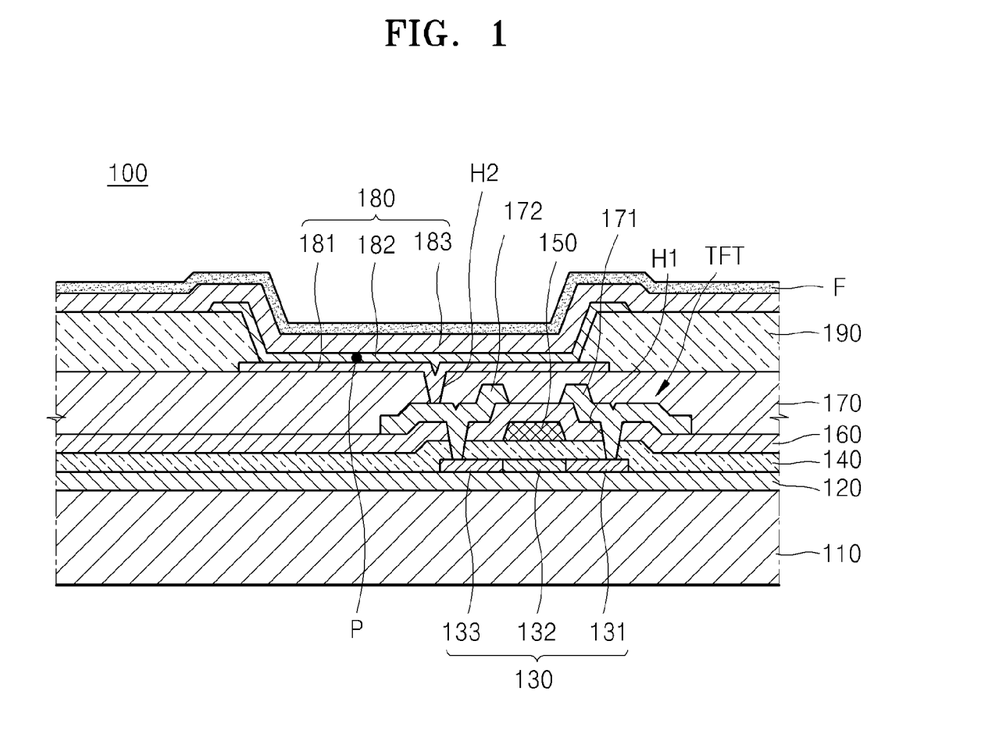
FIG. 1 is a cross-sectional view illustrating a portion of a display panel including a fault.
Figure 2:
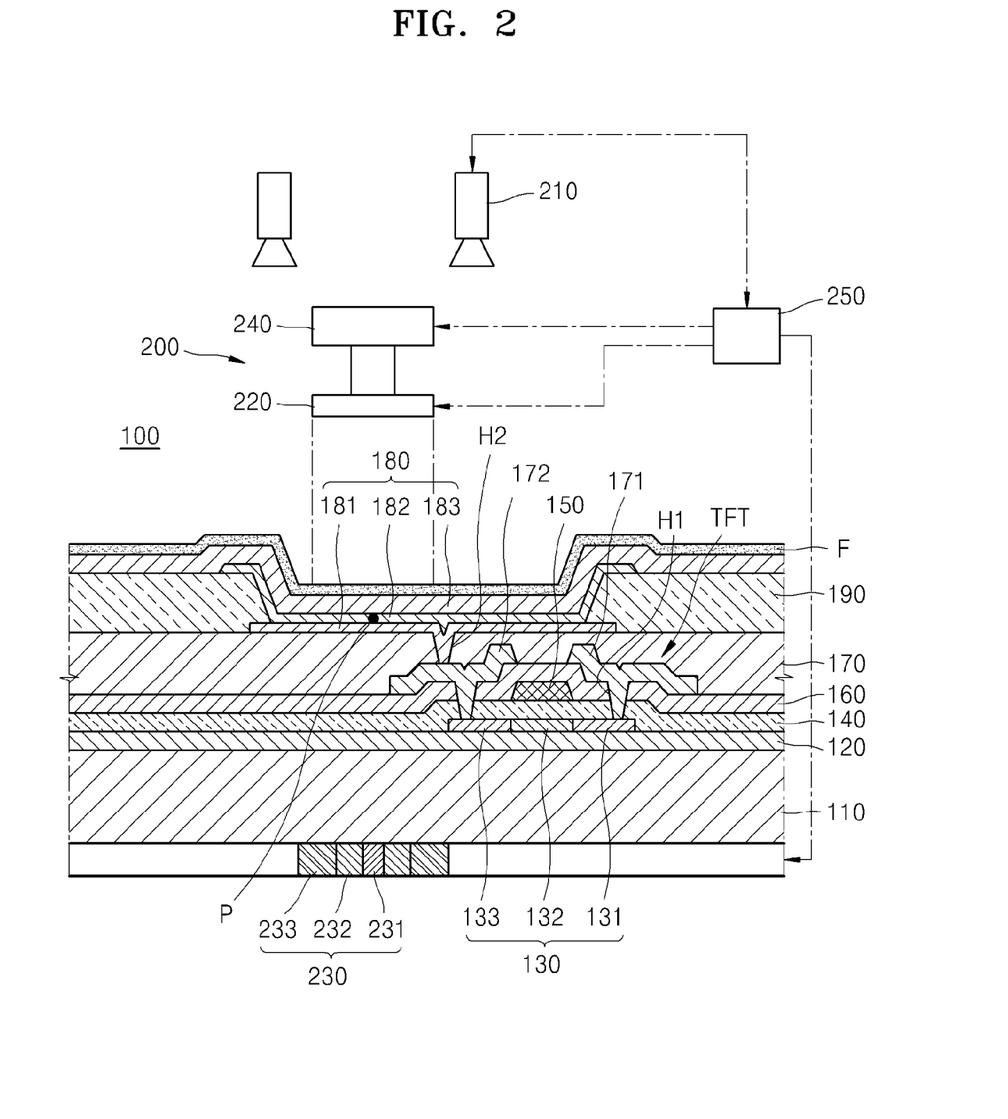
FIGS. 2 to 5 are conceptual views illustrating an order of repairing the fault of the display panel of FIG. 1 by using an apparatus for repairing the display panel, according to an embodiment of the present invention.
Figure 3:
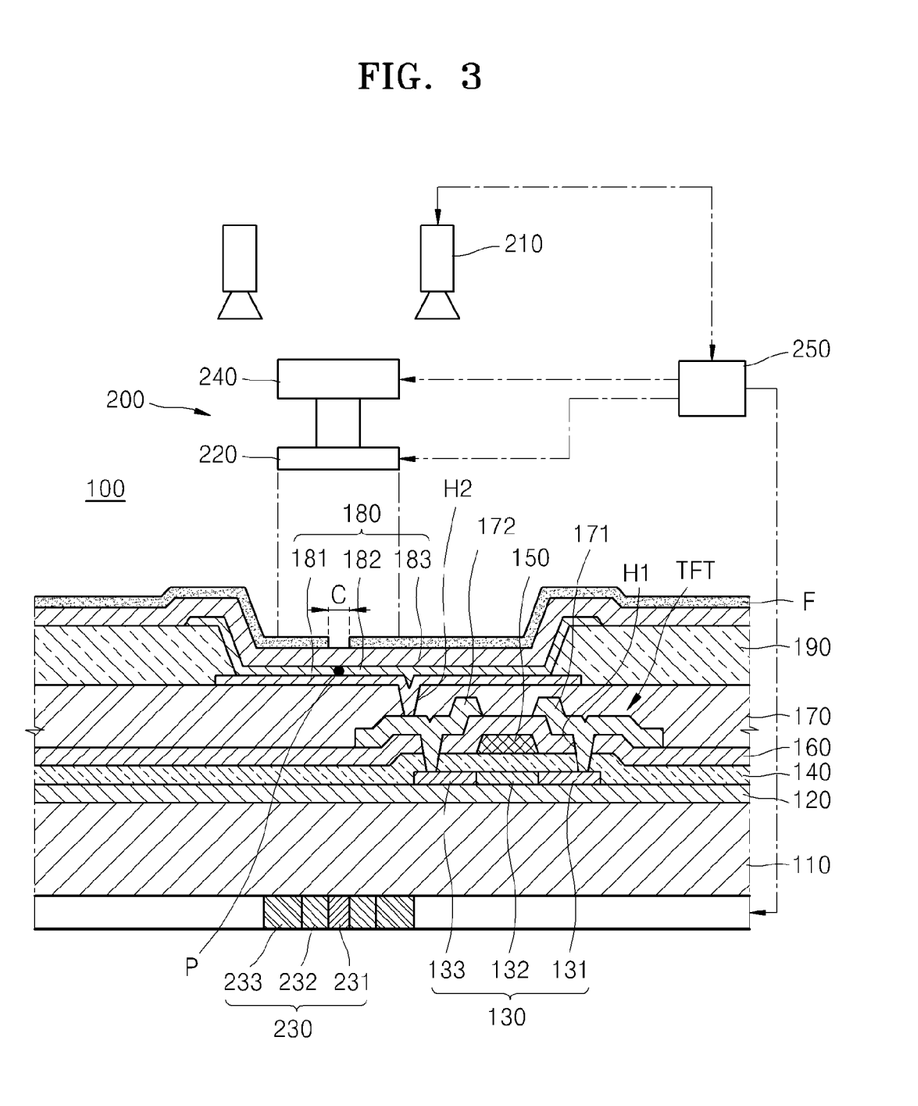
Figure 4:
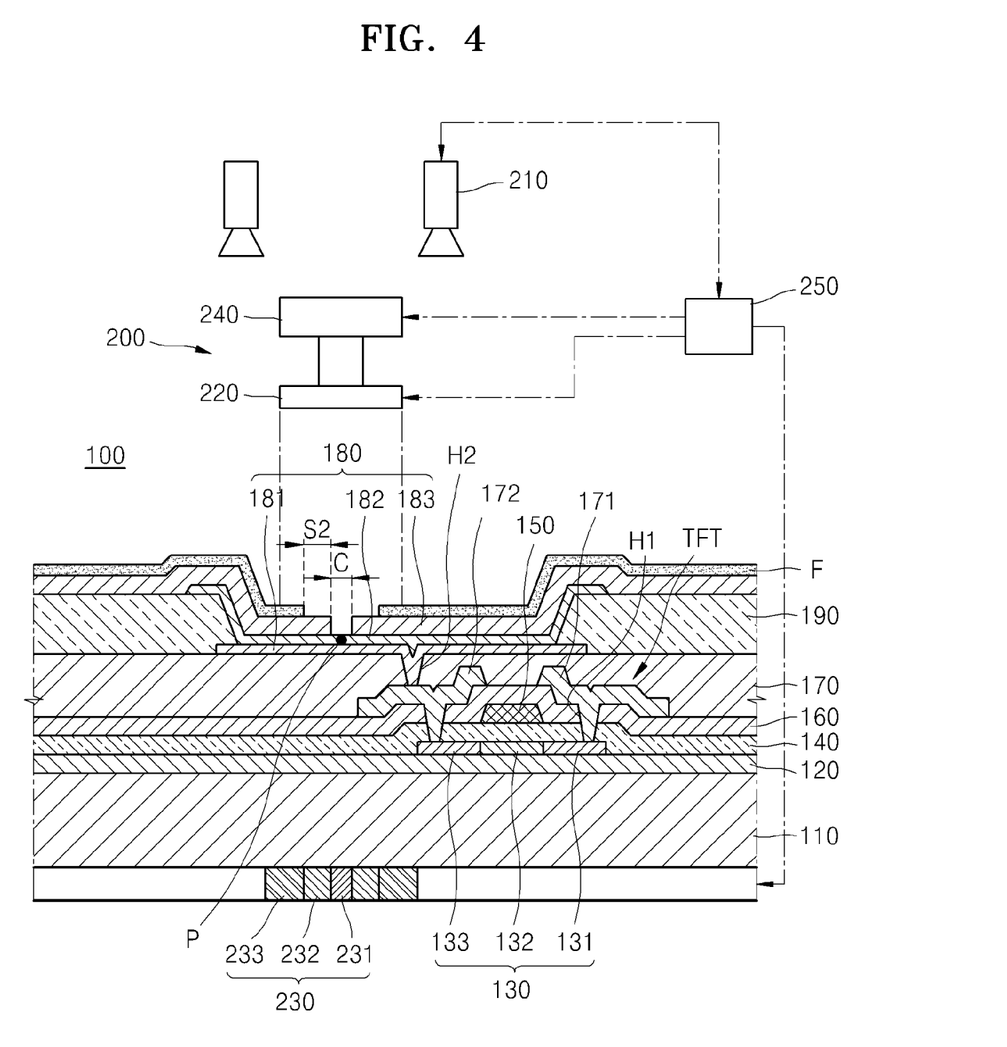

FIG. 1 is a cross-sectional view illustrating a portion of a display panel 100 including a fault.

Referring to FIG. 1, a display panel 100 may include a first substrate 110 and an emission unit (not shown). Also, the display panel 100 may include a thin film encapsulating layer (not shown) or a second substrate (not shown), on the emission unit. The thin film encapsulating layer and the second substrate are the same or similar to those used in a general display panel, and thus, detailed description thereof will be omitted.

The emission unit may be formed on the first substrate 110. The emission unit may include a thin film transistor (TFT), and a passivation layer 170 may be formed to cover the emission unit and the TFT. An organic light-emitting diode 180 may be formed on the passivation layer 170.

The first substrate 110 may include glass, but is not limited thereto, and may include plastic or metal, such as, for example, stainless steel (SUS) or titanium (Ti).

Alternatively, the first substrate 110 may include polyimide (PI). Hereinafter, for convenience of description, an example in which the first substrate 110 includes glass will be described in detail.

On an upper surface of the first substrate 110, a buffer layer 120 including an organic compound and/or an inorganic compound is further provided. The buffer layer 120 may include, for example, $SiO_x(x≥1)$ or $SiN_x(x≥1)$.

An active layer 130 having a predetermined pattern is formed on the buffer layer 120, and the active layer 130 is covered by a gate insulating layer 140. The active layer 130 includes a source area 131 and a drain area 133, and further includes a channel area 132 between the source and drain areas 131 and 133.

The active layer 130 may include various materials. For example, the active layer 130 may include an inorganic semiconductor material such as, for example, amorphous silicon or crystalline silicon. As another example, the active layer 130 may include an oxide semiconductor material. Also, as another example, the active layer 130 may include an organic semiconductor material. Hereinafter, for convenience of description, an example in which the active layer 130 includes amorphous silicon will be described in detail.

The active layer 130 may be formed by forming an amorphous silicon layer on the buffer layer 120, crystallizing the amorphous silicon layer to form a polycrystalline silicon layer, and patterning the polycrystalline silicon layer. In the active layer 130, the source and drain areas 131 and 133 are doped with impurities according to whether the TFT is a driving TFT or a switching TFT.

On an upper surface of the gate insulating layer 140, a gate electrode 150 that corresponds to the active layer 130, and an interlayer insulating layer 160 that covers the gate electrode 150 are formed.

A contact hole H1 is formed in the interlayer insulating layer 160 and the gate insulating layer 140, and a source electrode 171 and a drain electrode 172 are formed on the interlayer insulating layer 160 such that they respectively contact the source area 131 and the drain area 133.

The passivation layer 170 is formed on the above-described TFT, and a pixel electrode 181 of the organic light-emitting device (OLED) 180 is formed on the passivation layer 170. The pixel electrode 181 contacts the drain electrode 172 of the TFT through a via hole H2 formed in the passivation layer 170. The passivation layer 170 may be formed as a single layer or layers of an inorganic material and/or an organic material. The passivation layer 170 may be formed as a planarization layer such that an upper surface thereof is flat regardless of curves in a lower layer thereof, or alternatively, curved correspondingly to the curves in the lower layer thereof. Also, the passivation layer 170 may include a transparent insulating material to obtain a resonance effect.

A pixel defining layer (PDL) 190 is formed by using an organic material and/or an inorganic material to cover the pixel electrode 181 and the passivation layer 170, and includes an opening so that the pixel electrode 181 is exposed.

In addition, an intermediate layer 182 and an opposite electrode 183 are formed on the pixel electrode 181.

The pixel electrode 181 functions as an anode electrode, and the opposite electrode 183 functions as a cathode electrode, or vice versa.

The pixel electrode 181 and the opposite electrode 183 are insulated from each other by the intermediate layer 182. Voltages of different polarities are applied via the intermediate layer 182 so that an organic emission layer (organic EML) emits light.

The intermediate layer 182 includes an organic EML. Alternatively, the intermediate layer 182 includes an organic EML, and may further include at least one of a hole injection layer (HIL), a hole transport layer (HTL), an electron transport layer (ETL), and an electron injection layer (EIL). The intermediate layer 182 may include the organic EML and further include other various functional layers.

A unit pixel includes a plurality of sub-pixels that may emit various colors of light. For example, the plurality of sub-pixels may include sub-pixels that emit red, green, and blue light, or sub-pixels that emit red, green, blue, and white light.

The plurality of sub-pixels may include the intermediate layer 182 having organic EMLs that emit various colors of light. For example, the plurality of sub-pixels may include the intermediate layer 182 having organic EMLs that emit red, green, and blue light.

As another example, the plurality of sub-pixels that emit various colors of light may include the intermediate layer 182 that includes organic EMLs that emit the same light, such as, for example, white, and may include a color converting layer or a color filter that converts white light into a predetermined colored light.

The intermediate layer 182 emitting white light may have various structures, such as for example a structure in which at least a light-emitting substance emitting red light, a light-emitting substance emitting green light, and a light-emitting substance emitting blue light are stacked on one another.

As another example for emitting white light, the intermediate layer 182 may include a structure in which at least a light-emitting substance emitting red light, a light-emitting substance emitting green light, and a light-emitting substance emitting blue light are mixed.

The colors, red, green, and blue, are only provided as examples, and the embodiments are not limited thereto. In other words, any combination of other various colors, which is capable of emitting white light, may be employed in addition to and/or instead of a combination of red, green and blue.

The display panel 100 may include a functional layer F formed on the opposite electrode 183. The functional layer F may be formed as a single layer or as multiple layers. For example, the functional layer F may include at least one of a first functional layer (not shown) formed of lithium fluoride (LiF), or the like, and a second functional layer (not shown) that protects the opposite electrode 183. Hereinafter, for convenience of description, a case where the functional layer F only includes the first functional layer will be described in detail.

A fault may be generated during a process of manufacturing the display panel 100, which is formed by stacking various layers as described above, due to external causes or particles generated when depositing each layer.

The fault may be generated in various ways. For example, the fault may be generated in the emission unit and cause a short circuit between the pixel electrode 181 and the opposite electrode 183. As another example, although not illustrated in FIG. 1, the fault may cause by a short circuit between wirings formed when manufacturing the display panel 100, or may damage and disconnect middle parts of the wirings.

Such faults are detected and repaired during or after a process of manufacturing the display panel 100. There are various methods of repairing such faults, for example, a fault may be repaired by removing a faulty portion of each layer by using a laser and forming the each layer again.

Hereinafter, an apparatus for repairing the display panel 100, which repairs a fault caused by a short circuit between the pixel electrode 181 and the opposite electrode 183 by using a laser, and a method of repairing the display panel 100 by using the apparatus will be described in detail.

Figure 5:
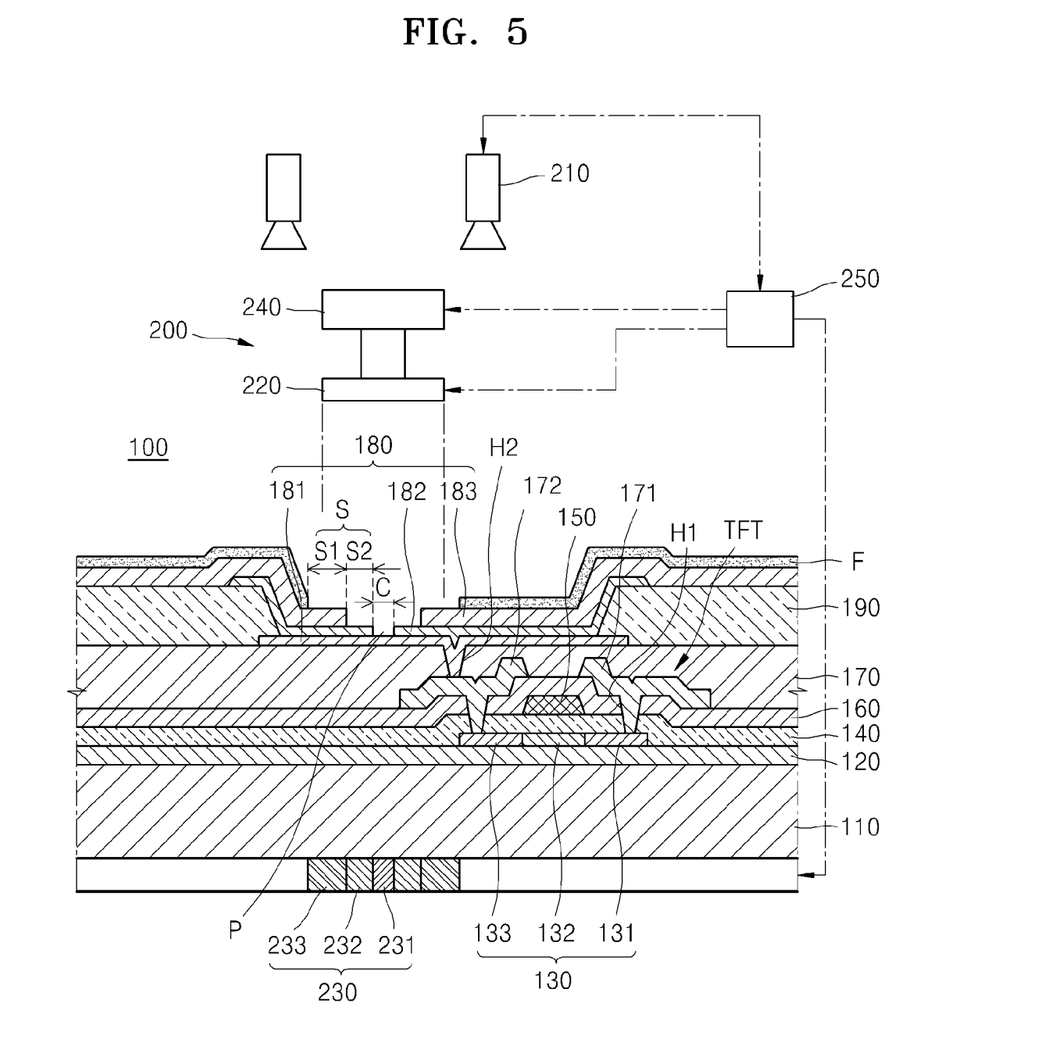
Figure 6:
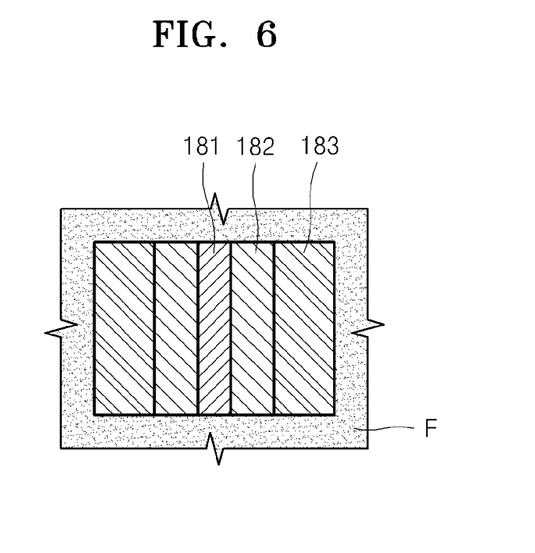
FIG. 6 is a plan view illustrating an etched portion of a display panel of FIG. 5.

FIGS. 2 to 5 are conceptual views illustrating an order of repairing the fault of the display panel 100 of FIG. 1 by using an apparatus 200 for repairing the display panel 100, according to an embodiment of the present invention. FIG. 6 is a plan view illustrating an etched portion of the display panel 100 of FIG. 5.

Referring to FIGS. 2 to 6, the apparatus 200 may include a capturing unit 210 that captures a faulty portion C of the display panel 100, a guide 230 on which the display panel 100 is disposed, and a laser emitter 220 that emits a laser onto the faulty portion C and a surrounding portion S of the faulty portion C. The faulty portion C may be defined by a predetermined area and the surrounding portion S may be defined by an area spaced apart from edges of the faulty portion C by a predetermined distance.

A surface temperature of the guide 230 may be changed. A temperature of a portion of the guide 230 disposed on a lower surface of the faulty portion C may be higher than a temperature of another portion of the guide 230 disposed on a lower surface of the surrounding portion S. Alternatively, the temperature of the portion of the guide 230 disposed on a lower surface of the surrounding portion S may be lower than a temperature of another portion of the guide 230 disposed on a lower surface of the faulty portion C. Alternatively, a temperature of the portion of the guide 230 disposed on a lower surface of the faulty portion C may be maintained at a high level while a temperature of other portions of the guide 230 disposed at a lower surface of the surrounding portion S may be maintained at a low level.

The guide 230 may be formed as a plate and include a thermo-electric device. In particular, the guide 230 may include a plurality of thermo-electric devices at an upper surface of the guide 230 on which the display panel 100 is mounted. Electric current may be applied to each thermo-electric device. However, the guide 230 is not limited to the description above, and may include any structure or apparatus that partially heats or cools the guide 230.

The laser emitter 220 may emit a laser in a line form or a laser that is block shaped. When the laser emitter 220 emits a laser that is block shaped, a laser may be irradiated onto a predetermined area. Hereinafter, for convenience of description, an example in which the laser emitter 220 emits the laser in a line form will be described in detail.

In the above-described case, at least one of the guide 230 and the laser emitter 220 may move linearly. Hereinafter, for convenience of description, an example in which the laser emitter 220 linearly moves will be described in detail.

The apparatus 200 may include a driver 240 that is provided to the laser emitter 220 and linearly moves the laser emitter 220, and a controller 250 that controls at least one of the capturing unit 210, the guide 230, the laser emitter 220, and the driver 240.

According to the method of repairing the display panel 100 by using the apparatus 200, the faulty portion C may be determined and repaired after the display panel 100 partially manufactured. Alternatively, the faulty portion C of the display panel 100 may be repaired after the display panel 100 is completely manufactured and then a second substrate (not shown) or a thin film encapsulating layer (not shown) is removed. Hereinafter, for convenience of description, an example in which the display panel 100 is partially manufactured and then the faulty portion C is determined and repaired will be described in detail.

The capturing unit 210 may capture an image of the display panel 100 and transfer the image to the controller 250. In this case, the controller 250 may apply electric current and signals to various lines of the display panel 100 to thus allow a predetermined emitter to emit light.

The controller 250 may detect a faulty pixel based on the image of the display panel 100 captured by the capturing unit 210. In particular, the controller 250 may determine that there is a fault, for example, when a pixel does not emit light or when a dim spot is generated in the display panel 100. Hereinafter, a process that includes etching and then repairing a portion where a dim spot is generated will be described.

As described above, the controller 250 may determine the portion where the dim spot is generated as the faulty portion C. A size of the faulty portion C may be slightly greater than an actual size of the dim spot. The controller 250 may not only determine the faulty portion C, but also the surrounding portion S. In this case, a size of a captured dim spot is calculated, and then, the faulty portion C may be determined as a quadrilateral shape having a first area in which the dim spot is included. Also, edges of the surrounding portion S may be determined as a quadrilateral shape having a second area that is different from the first area. The second area may be greater than the first area, and the surrounding portion S may be formed as a quadrilateral band shape which surrounds the faulty portion C. The faulty portion C may be smaller than the surrounding portion S such that the faulty portion C is disposed inside the surrounding portion S. In this case, the controller 250 may determine the faulty portion C and the surrounding portion S as described above by using predetermined data or formulae.

When the above-described process is complete, the controller 250 may control the driver 240 such that the laser emitter 220 is moved above the faulty portion C. Then, the controller 250 may etch a portion corresponding to the faulty portion C by using the laser emitter 220.

When laser is being emitted as described above, the controller 250 may control the driver 240 such that the laser emitter 220 is linearly moved. In this case, the surrounding portion S that includes the faulty portion C may be removed together due to a laser emitted from the laser emitter 220. In detail, the laser emitter 220 may etch each layer in a quadrilateral shape by emitting laser while moving linearly. The laser may be used to etch from the faulty portion C to the surrounding portion S.

When the laser emitter 220 is emitting laser, the laser may be used to partially remove the opposite electrode 183 and the intermediate layer 182. At the same time, the faulty portion C that includes a particle P on the intermediate layer 182 may also be removed.

While the laser emitter 220 is emitting laser as described above, the guide 230 may control respective temperatures of the faulty portion C and the surrounding portion S such that they are different from each other. The guide 230 heats a lower surface of the faulty portion C so that a temperature of the faulty portion C is higher than a temperature of the surrounding portion S. According to another embodiment, a lower surface of the surrounding portion S may be cooled so that the temperature of the faulty portion C is higher than the temperature of the surrounding portion S. According to another embodiment, the lower surface of the faulty portion C may be heated and the lower surface of the surrounding portion S may be cooled so that the temperature of the faulty portion C is higher than that of the surrounding portion S. Hereinafter, for convenience of description, an example in which only the lower surface of the faulty portion C is heated will be described in detail.

When the lower surface of the faulty portion C is heated by using the guide 230, the temperature of the faulty portion C becomes higher than temperatures of other surfaces due to the laser and heating, and thus, the faulty portion C may be etched more quickly than the surrounding portion S. However, since the surrounding portion S only receives the laser, the surrounding portion S may be etched relatively slower than the faulty portion C. Therefore, an etching depth of the faulty portion C may be greater than that of the surrounding portion S.

Also, when the faulty portion C and the surrounding portion S are etched as described above, the opposite electrode 183 and the intermediate layer 182 included in the faulty portion C may be removed. However, in the surrounding portion S, the opposite electrode 183 may be removed but the intermediate layer 182 may be not removed. Therefore, a removed portion of the opposite electrode 183 may include both the faulty portion C and the surrounding portion S, but a removed portion of the intermediate layer 182 may include only the faulty portion C. The removed portion of the opposite electrode 183 may be larger than the removed portion of the intermediate layer 182. A portion of the intermediate layer 182 may be exposed via an opening in the opposite electrode 183.

Alternatively, when the functional layer F is formed on the opposite electrode 183, etching may be performed identically or similarly as in the above-described embodiment. For example, the surrounding portion S may be divided into a first surrounding portion S1 and a second surrounding portion S2. The second surrounding portion S2 may surround the faulty portion C, and the first surrounding portion S1 may surround the second surrounding portion S2. The first surrounding portion S1 and the second surrounding portion S2 may be quadrilateral as defined by respective edges thereof.

When portions are determined as described above, the controller 250 may control the laser emitter 220 and the guide 230. The controller 250 may emit a laser by using the laser emitter 220 and drive the driver 240 to linearly move the laser emitter 220. Also, while the above-described operations are being performed, the controller 250 may adjust a temperature of the guide 230. For example, the controller 250 may adjust a temperature of the guide 230 such that a temperature of the guide 230 that is disposed at a lower surface of the faulty portion C is a first temperature, a temperature of the guide 230 that is disposed at a lower surface of the second surrounding portion S2 is a second temperature, and a temperature of the guide 230 that is disposed at a lower surface of the first surrounding portion S1 is a third temperature. In this case, the controller 250 may adjust the temperature of the guide 230 such that the first to third temperatures are different from each other. For example, controller 250 may adjust the temperature of the guide 230 such that the first to third temperatures decrease in a sequential order. The first temperature may be higher than the second temperature, and the second temperature may be higher than the third temperature.

The first to third temperatures may be adjusted by using various methods. For example, an amount of heat applied to a lower surface 231 of the faulty portion C, an amount of heat applied to a lower surface 232 of the second surrounding portion S2, and an amount of heat applied to a lower surface 233 of the first surrounding portion S1 may be reduced in a sequential order, as described above. Alternatively, the amount of heat respectively applied to the lower surfaces 231 and 232 may be sequentially reduced, and heat may not be applied to the lower surface 233. Alternatively, the amount of heat respectively applied to the lower surfaces 231 and 232 may be sequentially reduced, and the lower surface 233 may be cooled. Alternatively, the lower surface 231 may be heated, and the lower surfaces 232 and 233 may be cooled. In this case, an amount in which the lower surface 232 is cooled may be different from that of the lower surface 233. Furthermore, at least one selected from cooling, applying heat, and maintaining room temperature may be performed such that the lower surfaces 231, 232, and 233 are cooled, heated, or maintained at room temperature so as to create a temperature gradient in the faulty portion C, the first surrounding portion S1, and the second surrounding portion S2. By using the above-described method, the guide 230 may be controlled such that the first, second, and third temperatures decrease in a sequential order.

When the temperature of each area is set as described above, the laser emitter 220 may emit a laser on the faulty portion C, the first surrounding portion S1, and the second surrounding portion S2. While emitting the laser in lines, the laser emitter 220 may linearly move according to operations of the driver 240.

The faulty portion C, the first surrounding portion S1, and the second surrounding portion S2 may be irradiated with the laser, and thereby the laser may be used to etch each layer. Due to the above-described temperature gradient, layers in the faulty portion C, the first surrounding portion S1, and the second surrounding portion S2 may respectively absorb different amounts of heat.

Since the faulty portion C is directly heated by heat from the laser or is further heated by an external heat source, the functional layer F, the opposite electrode 183, and the intermediate layer 182 may all be etched in the faulty portion C. While being heated by the laser, the second surrounding portion S2 receives a smaller amount of external heat than the faulty portion C or absorbs some heat by being cooled. Thus, only the functional layer F and the opposite electrode 183 may be etched in the second surrounding portion S2. Also, while being heated by the laser, the first surrounding portion S1 does not receive external heat or absorbs a larger amount of heat by being cooled, wherein the amount of heat absorbed by the first surrounding portion S1 is greater than the amount of heat absorbed by the second surrounding portion S2. Thus, only the functional layer F is removed in the first surrounding portion S1.

Therefore, the functional layer F may be etched in all of the faulty portion C, the first surrounding portion S1, and the second surrounding portion S2, and the opposite electrode 183 may be etched in the faulty portion C and the second surrounding portion S2. Also, the intermediate layer 182 may be etched in the faulty portion C.

In particular, an etched end of the intermediate layer 182 and an etched end of the opposite electrode 183 may be externally exposed. Also, the etched end of the intermediate layer 182, the etched end of the opposite electrode 183, and an etched end of the functional layer F may be formed in a stair-step structure and have different heights.

When the layers are formed as described above, each layer may be identified by using apparatuses such as for example an electronic microscope.

When the particle P of the faulty portion C is removed by completing the above-described process, each layer may be sequentially stacked again. For example, the intermediate layer 182 may be stacked first, and then the opposite electrode 183 and the functional layer F may be sequentially stacked. Each layer may be stacked by using a stacking method appropriate for each layer selected from a slit nozzle method, a mini chemical vapor deposition (CVD) method, an inkjet printing method, and the like.

In general, the apparatus 200 may be used to repair with higher efficiency and accuracy than when only using a laser. For example, when a laser is used to repair the faulty portion C, each layer may be vertically cut, without height differences between the layers due to directionality of the laser. Accordingly, when each layer is recreated to repair the faulty portion C, it is not possible to identify a thickness of each layer to be recreated and a connection relationship between layers.

However, the apparatus 200 may solve the above-described problem by etching layers stacked in the faulty portion C such that the etched layers form a stair-step structure and then repairing the faulty portion C.

Therefore, the apparatus 200 and the method of repairing the display panel 100 may increase repairing accuracy by etching layers stacked in the faulty portion C such that the etched layers form a stair-step structure and then repairing the faulty portion C.

Also, the apparatus 200 and the method of repairing the display panel 100 may repair a fault in the display panel 100 by using a simple structure, which may thus increase operation efficiency.

The apparatus 200 and the method of repairing the display panel 100 may quickly repair the fault in the display panel 100.

It should be understood that the embodiments described herein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A method of repairing a display panel, comprising:
   identifying a faulty portion of the display panel;
   etching the faulty portion and a first surrounding portion of the faulty portion by irradiating the faulty portion and the first surrounding portion with a laser; and
   adjusting at least one of a temperature of the faulty portion or a temperature of the first surrounding portion while irradiating the faulty portion and the first surrounding portion with the laser,
   wherein the faulty portion and the first surrounding portion are disposed in a path of the laser,
   wherein the temperature of the faulty portion is maintained higher than the temperature of the first surrounding portion while irradiating the fault portion and the first surrounding portion with the laser.

2. The method of claim 1, wherein the faulty portion is heated such that the temperature of the faulty portion increases.

3. The method of claim 1, wherein the surrounding portion is cooled such that the temperature of the first surrounding portion decreases.

4. The method of claim 1, wherein the faulty portion is heated such that the temperature of the faulty portion increases, and wherein the first surrounding portion is cooled such that the temperature of the first surrounding portion decreases.

5. The method of claim 1, wherein the faulty portion and the first surrounding portion are etched in a stair-step structure.

6. The method of claim 5, wherein an etching depth of the faulty portion is greater than an etching depth of the first surrounding portion.

7. The method of claim 1, wherein the faulty portion and the first surrounding portion are formed as a plurality of layers, and wherein the repairing of the display panel comprises sequentially stacking layers that are the same as layers etched in the faulty portion and the first surrounding portion.

8. The method of claim 1 further comprising etching a second surrounding portion of the faulty portion by irradiating the second surrounding portion with a laser.

9. The method of claim 8 further comprising adjusting a temperature of the second surrounding portion while irradiating the second surrounding portion with the laser.

10. The method of claim 8, wherein the faulty portion, the first surrounding portion and the second surrounding portion are formed as a plurality of layers, and wherein the repairing of the display panel comprises sequentially stacking layers that are the same as layers etched in the faulty portion, the first surrounding portion and the second surrounding portion.

11. A method of repairing a display panel, comprising:
identifying a faulty portion of the display panel;
etching the faulty portion and a first surrounding portion of the faulty portion by irradiating the faulty portion and the first surrounding portion with a laser; and
simultaneously adjusting a temperature of the faulty portion and a temperature of the first surrounding portion while irradiating the faulty portion and the first surrounding portion with the laser such that the temperature of the faulty portion increases and the temperature of the first surrounding portion simultaneously decreases,
wherein the faulty portion and the first surrounding portion are disposed in a path of the laser.

12. The method of claim 11, wherein the faulty portion and the first surrounding portion are etched in a stair-step structure.

13. The method of claim 12, wherein an etching depth of the faulty portion is greater than an etching depth of the first surrounding portion.

14. The method of claim 11, wherein the faulty portion and the first surrounding portion are formed as a plurality of layers, and wherein the repairing of the display panel comprises sequentially stacking layers that are the same as layers etched in the faulty portion and the first surrounding portion.

15. The method of claim 11 further comprising etching a second surrounding portion of the faulty portion by irradiating the second surrounding portion with a laser.

16. The method of claim 15 further comprising adjusting a temperature of the second surrounding portion while irradiating the second surrounding portion with the laser.

17. The method of claim 15, wherein the faulty portion, the first surrounding portion and the second surrounding portion are formed as a plurality of layers, and wherein the repairing of the display panel comprises sequentially stacking layers that are the same as layers etched in the faulty portion, the first surrounding portion and the second surrounding portion.

18. A method of repairing a display panel, comprising:
identifying a faulty portion of the display panel;
etching the faulty portion and a first surrounding portion of the faulty portion by irradiating the faulty portion and the first surrounding portion with a laser; and
adjusting at least of a temperature of the faulty portion or a temperature of the first surrounding portion by a guide while irradiating the faulty portion and the first surrounding portion with the laser,
wherein the faulty portion and the first surrounding portion is disposed in path of the laser,
wherein the temperature of the faulty portion maintains higher than the temperature of the first surrounding portion while irradiating the faulty portion and the first surrounding portion with the laser, and
wherein the display panel is disposed on the guide.

19. The method of claim 18, wherein the guide is formed as a plate including a thermo-electric device.

* * * * *